(12) United States Patent
Kawahito et al.

(10) Patent No.: US 9,832,409 B2
(45) Date of Patent: Nov. 28, 2017

(54) IMAGE SENSOR

(71) Applicant: NATIONAL UNIVERSITY CORPORATION SHIZUOKA UNIVERSITY, Shizuoka-shi, Shizuoka (JP)

(72) Inventors: Shoji Kawahito, Hamamatsu (JP); Keita Yasutomi, Hamamatsu (JP)

(73) Assignee: NATIONAL UNIVERSITY CORPORATION SHIZUOKA UNIVERSITY (JP)

(*) Notice: Subject to any disclaimer, the term of this patent is extended or adjusted under 35 U.S.C. 154(b) by 0 days.

(21) Appl. No.: 15/116,732

(22) PCT Filed: Feb. 6, 2015

(86) PCT No.: PCT/JP2015/053370
§ 371 (c)(1),
(2) Date: Aug. 4, 2016

(87) PCT Pub. No.: WO2015/119243
PCT Pub. Date: Aug. 13, 2015

(65) Prior Publication Data
US 2016/0353045 A1    Dec. 1, 2016

(30) Foreign Application Priority Data

Feb. 7, 2014    (JP) .................................. 2014-022344

(51) Int. Cl.
*H04N 5/376* (2011.01)
*H04N 5/225* (2006.01)
(Continued)

(52) U.S. Cl.
CPC ......... *H04N 5/3765* (2013.01); *G01S 7/4863* (2013.01); *G01S 17/89* (2013.01);
(Continued)

(58) Field of Classification Search
CPC .... H04N 5/3765; H04N 5/2256; H04N 5/374; G06T 5/00; G06T 3/00; G06T 5/006;
(Continued)

(56) References Cited

U.S. PATENT DOCUMENTS

| 8,488,203 B2* | 7/2013 | Higashiyama ....... H04N 1/3878 358/3.15 |
| 2002/0000851 A1* | 1/2002 | Miyazaki .................. G06F 1/10 327/141 |

(Continued)

FOREIGN PATENT DOCUMENTS

| JP | 2000-298532 A | 10/2000 |
| JP | 2009-290345 A | 12/2009 |
| WO | WO 2014/021417 A1 | 2/2014 |

OTHER PUBLICATIONS

International Search Report for International Application No. PCT/JP2015/053370 dated Apr. 8, 2015.
(Continued)

*Primary Examiner* — Lin Ye
*Assistant Examiner* — Marly Camargo
(74) *Attorney, Agent, or Firm* — Ostrolenk Faber LLP

(57) ABSTRACT

A high-accurate imaging increased in time resolution can be made. The camera device is provided with a plurality of pixels that include a light-receiving surface embedded region to convert incident light into charges, a charge accumulation region to accumulate the charges, and a gate electrode to control the charges to be transferred from the light-receiving surface embedded region to the charge accumulation region, and are one-dimensionally arranged in each of a plurality of columns, a timing generation circuit which generates a control pulse voltage to be applied to the gate electrode, and a correction circuit unit which is provided in accordance with each of a plurality of columns of the pixels, delays the control pulse voltage in a variable time, and (Continued)

applies the control pulse voltage to the gate electrodes of the plurality of pixels belonging to a column corresponding to the control pulse voltage.

6 Claims, 14 Drawing Sheets

(51) Int. Cl.
H04N 5/374 (2011.01)
G06T 5/00 (2006.01)
H01L 27/146 (2006.01)
G01S 7/486 (2006.01)
H01L 27/148 (2006.01)
G01S 17/89 (2006.01)

(52) U.S. Cl.
CPC .. *H01L 27/14609* (2013.01); *H01L 27/14806* (2013.01); *H04N 5/2256* (2013.01); *H04N 5/374* (2013.01)

(58) Field of Classification Search
CPC . G01S 7/4863; G01S 17/89; H01L 27/14609; H01L 27/14806
USPC ............... 348/211.9, 295, 312; 382/289; 356/5.01–5.08; 250/208.1; 375/371; 714/775
See application file for complete search history.

(56) References Cited

U.S. PATENT DOCUMENTS

| | | | | |
|---|---|---|---|---|
| 2006/0001918 A1* | 1/2006 | Okano | ................ | H04N 5/3653 358/482 |
| 2008/0303931 A1* | 12/2008 | Taguchi | ................ | H04N 5/335 348/308 |
| 2011/0037871 A1* | 2/2011 | Suzuki | ................ | H04N 5/378 348/222.1 |
| 2015/0271427 A1* | 9/2015 | Okano | ................ | H04N 5/3653 348/301 |

OTHER PUBLICATIONS

PCT/IB/338 Form PCT Notification of Transmittal of Translation of the International Preliminary Report on Patentability with Form PCT/ISA/237 PCT Translation of Written Opinion of the International Searching Authority dated Aug. 18, 2016.

S. Kawahito et al., "A CMOS time-of-flight range image sensor with gates-on-field-oxide structure", IEEE Sensors Journal, Dec. 2007, p. 1578-p. 1586.

Keita Yasutomi, "A Time-of-Flight Image Sensor with Sub-mm Resolution Using Draining Only Modulation Pixels, URL:http://www.imagesensors.org/Past%20Workshops/2013%20Workshop/2013%20Papers/10-5_105-Yasutomi_paper.pdf>", 2013 International Image Sensor Workshop, Jun. 12, 2013.

\* cited by examiner

ID
IMAGE SENSOR

CROSS-REFERENCE TO RELATED APPLICATIONS

The present application is a 35 U.S.C. §§371 national phase conversion of PCT/JP2015/053370, filed Feb. 6, 2015, which claims priority to Japanese Patent Application No. 2014-022344, filed Feb. 7, 2014, the contents of both of which are incorporated herein by reference. The PCT International Application was published in the Japanese language.

TECHNICAL FIELD

An aspect of the invention relates to an image sensor containing a plurality of pixels.

BACKGROUND ART

Conventionally, a development on a CCD (Charge Coupled Device) image sensor, a CMOS (Complementary Metal Oxide Semiconductor) image sensor employing a TOF (Time Of Flight) method in which a traveling time of light is measured to measure a distance, and an image sensor for fluorescence life measurement, Raman microspectroscopic imaging, or near infrared microspectroscopic imaging has be progressed. For example, a TOF distance image sensor is disclosed in the following Non Patent documents 1 and the following Patent document 2. In the TOF distance image sensor, there is employed an indirect method in which a lock-in is detected in synchronization with a light source, and a distance resolution is increased.

CITATION LIST

Non Patent Literature

Non Patent Literature 1: S. Kawahito et al., "A CMOS time-of-flight range image sensor with gates-on-field-oxide structure"; IEEE Sensors Journal, Vol. 7, No. 12, pp. 1578-1586, December 2007.
Non Patent Literature 2: K. Yasutomi et al., "A Time-of-Flight Image Sensor with Sub-mm Resolution Using Draining Only Modulation Pixels," Proc. 2013 Intl. Image Sensor Workshop, pp. 361-364, June 2013.

SUMMARY OF INVENTION

Technical Problem

However, there is a problem in that a skew occurs in a control signal to be supplied to a pixel as a high time resolution is requested for the conventional image sensor. The skew of the control signal occurs from a variation in manufacturing buffers provided in a supply line of the control signal or a delay in the supply line. The skew reaches about several hundred pico seconds to a nano second depending on a pixel. For example, in a case where the image sensor is realized to have a resolution of several pico seconds as disclosed in Non Patent Literature 2, a measurement range covers about several pico seconds. Therefore, a distance is hardly calculated due to the skew, and the accuracy in imaging is lowered.

An aspect of the invention has been made in view of such a problem, and an object thereof is to provide an image sensor in which a high-accurate imaging increased in time resolution can be made.

Solution to Problem

To solve the above described problem, an image sensor according to an aspect of the invention includes: a plurality of photoelectric conversion elements that include a light-receiver to convert incident light into charges, a charge accumulation unit to accumulate the charges, and a gate electrode to control the charges to be transferred from the light-receiver to the charge accumulation unit, and are one-dimensionally arranged in each of a plurality of columns; a clock input unit that inputs a control clock to be applied to the gate electrode; and a first delay adjustment unit that is provided in correspondence with each of the plurality of columns of the photoelectric conversion elements or a group of the photoelectric conversion elements, delays the control clock input by the clock input unit in a variable time, and applies the control clock to the gate electrodes of the plurality of photoelectric conversion elements belonging to a corresponding column.

According to such an image sensor, a transfer timing of charges from a light-receiver to a charge accumulation unit in each photoelectric conversion element is controlled by inputting a control clock from a clock input unit to gate electrodes of a plurality of photoelectric conversion elements which are arranged in each of a plurality of columns. At that time, the control clock input to each photoelectric conversion element passes through a first delay adjustment unit provided for the photoelectric conversion element or each of the plurality of columns of a group of the photoelectric conversion elements, so that a variable delay time is set for each column. Therefore, it is possible to cancel a difference in transfer delay of each column which is easily generated by a characteristic difference of a buffer provided between the clock input unit and the photoelectric conversion element, and the skew of the control signal between the columns of the photoelectric conversion elements can be prevented. As a result, a high-accurate imaging increased in time resolution can be made.

The first delay adjustment unit may include a storage unit that stores a value for determining a delay time, and a delay adjustment circuit that changes the signal delay characteristic according to the value stored in the storage unit. With such a configuration of the first delay adjustment unit, the signal delay characteristic of the first delay adjustment unit can be changed by adjusting a value stored in a storage unit. Therefore, a difference in transfer delay for each column of the photoelectric conversion element can be easily cancelled.

In addition, the plurality of photoelectric conversion elements or a group of the plurality of photoelectric conversion elements may further be one-dimensionally arranged in each of a plurality of rows, the plurality of photoelectric conversion elements or the group of the plurality of photoelectric conversion elements may further include: a second delay adjustment unit that delays the control clock input by the clock input unit in a variable time for each of the plurality of rows, and applies the control clock to the gate electrodes of the plurality of photoelectric conversion elements belonging to a row to which the control clock corresponds. With such a configuration, it is possible to cancel the difference in transfer delay for each row caused by a wiring unit between the clock input unit and the photoelectric conversion element, and the skew of the control signal between the rows of the photoelectric conversion elements can be prevented from occurring. As a result, a high-accurate imaging more increased in time resolution can be made.

Furthermore, the second delay adjustment circuit may include a storage unit that is provided in accordance with each of the plurality of rows of the photoelectric conversion elements, and stores a value for determining a delay time, and a delay adjustment circuit that is provided for each of the plurality of photoelectric conversion elements, and changes the signal delay characteristic for each row of the photoelectric conversion elements in accordance with the value stored in the storage unit. With such a configuration of a second delay adjustment unit, the signal delay characteristic of the second delay adjustment unit provided for each row can be changed by adjusting the value stored in the storage unit. Therefore, the difference in transfer delay of the photoelectric conversion element can be easily cancelled.

In addition, furthermore, the second delay adjustment circuit may include a storage unit that is provided for each of the plurality of photoelectric conversion elements, and stores a value for determining a delay time, and a delay adjustment circuit that is provided for each of the plurality of photoelectric conversion elements, and changes the signal delay characteristic for each pixel to which the photoelectric conversion element belongs in accordance with the value stored in the storage unit. Even with such a configuration of the second delay adjustment unit, the signal delay characteristic of the second delay adjustment unit can be changed for each row by adjusting the value stored in the storage unit. Therefore, the difference in transfer delay of the photoelectric conversion element can be easily cancelled.

Furthermore, in addition, the second delay adjustment circuit may include a storage unit that is provided for each group of the plurality of photoelectric conversion elements, and stores a value for determining a delay time, a delay adjustment circuit that is provided for each group of the plurality of photoelectric conversion elements, and changes the signal delay characteristic for each group of the photoelectric conversion elements in accordance with the value stored in the storage unit. Even with such a configuration of the second delay adjustment unit, the signal delay characteristic of the second delay adjustment unit can be changed for each row by adjusting the value stored in the storage unit. Therefore, the difference in transfer delay of the photoelectric conversion element can be easily cancelled.

Advantageous Effects of Invention

According to an aspect of the invention, a high-accurate imaging increased in time resolution can be made.

DESCRIPTION OF EMBODIMENTS

Figure 1:
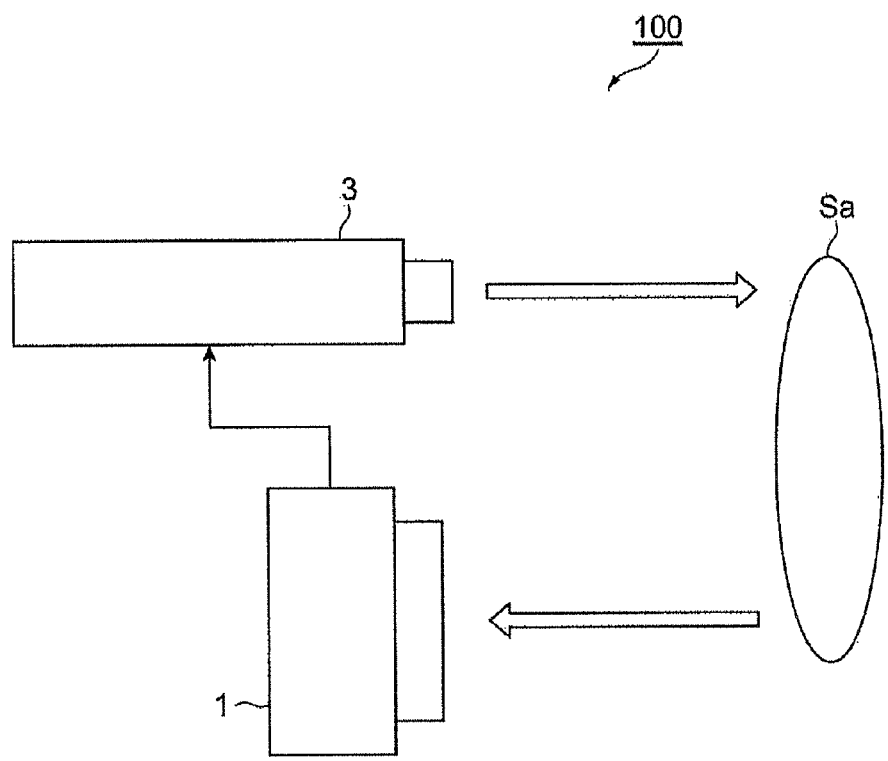
FIG. 1 is a diagram schematically illustrating a configuration of a measurement system 100 which includes a camera device 1 (a distance measuring device) according to an embodiment of the invention.

Herein, embodiments of a distance measuring device (an image sensor) according to an aspect of the invention will be described with reference to the drawings. Further, the identical or corresponding portions in the drawings will be attached with the same symbols, and the redundant description will be omitted. In addition, the respective drawings are created for the explanation, in which the description target portions are highlighted in particular. Therefore, dimensions and ratios of the respective members in the drawings are not necessarily matched with the actual ones.

FIG. 1 is a diagram schematically illustrating a configuration of a measurement system 100 which includes a camera device (the image sensor which is the distance measuring device) 1 according to an embodiment of the invention. The measurement system 100 is used to measure a distance up to a target Sa using a TOF (Time Of Flight) method, and is configured to include a laser light source 3 which emits light toward the target Sa and the camera device 1 which detects the light reflected from the target Sa. The laser light source 3 is a light source device which can emits pulse light of which the pulse width is sufficiently shorter than a response time of a light-receiver of the camera device 1 which will be described below. For example, the laser light source is configured to emit the pulse light of which the center wavelength is 445 nm and the pulse width is 100 psec. Further, the center wavelength and the pulse width of the light emitted by the laser light source 3 are not limited to the above values, and may be set to various values.

Figure 2:
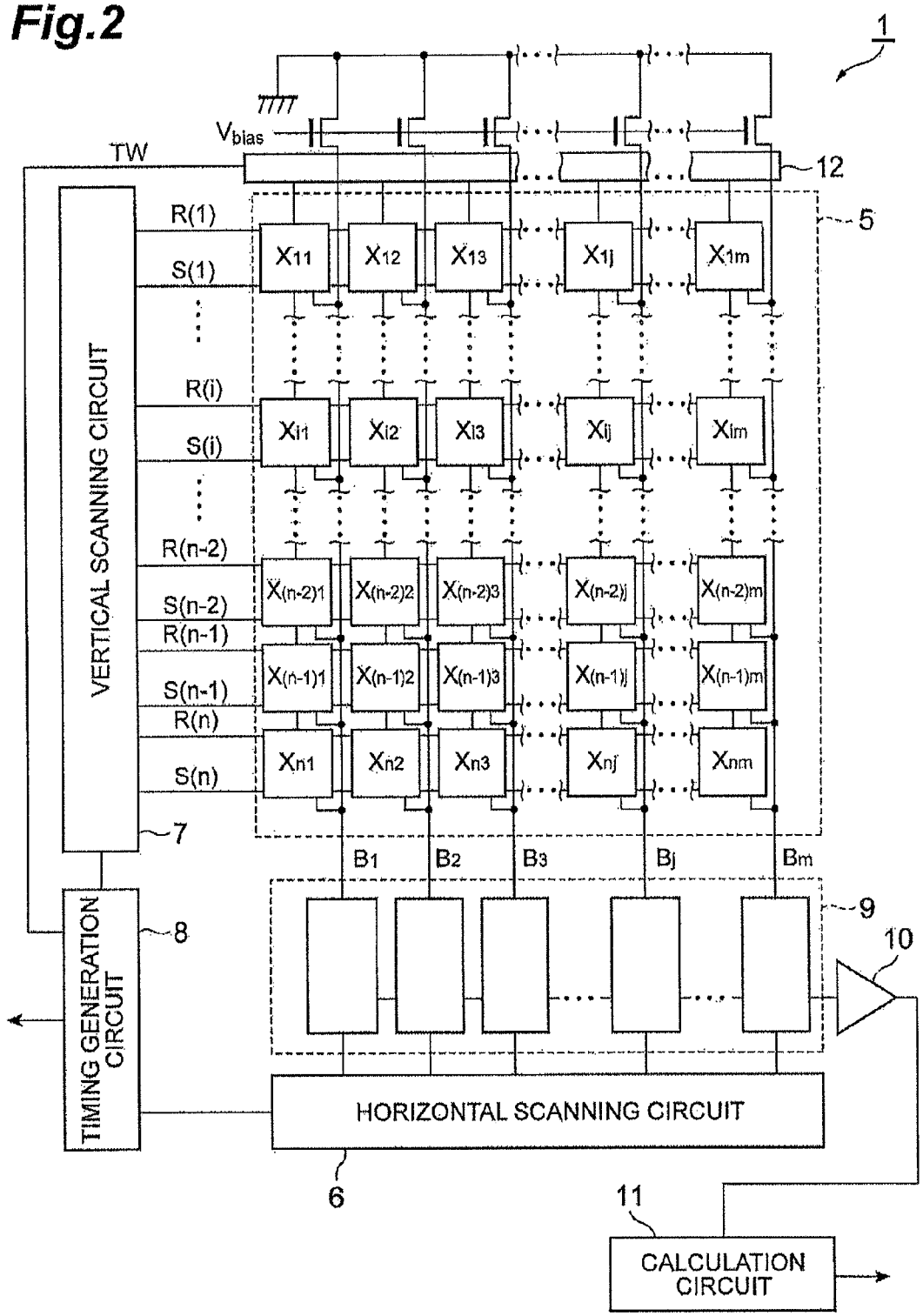
FIG. 2 is a block diagram schematically illustrating a configuration of the camera device 1 of FIG. 1.

FIG. 2 is a block diagram illustrating a configuration of the camera device 1. The camera device 1 is configured such that a pixel array portion 5 and peripheral circuit units 6, 7, 8, 9, 10, and 12 are integrated on the same semiconductor chip as illustrated in the drawing. A circuit unit 11 is configured on a separate circuit in the external camera device 1 of the semiconductor chip. Further, the circuit unit 11 may be integrated on the same semiconductor chip together with the pixel array portion 5 and the peripheral circuit units 6, 7, 8, 9, 10, and 12.

In the pixel array portion 5, a number of pixels (photoelectric conversion elements) Xij (herein, i is an integer of 1 to n, and j is an integer 1 to m) are arranged in a two dimensional matrix shape, and forms a capturing region of a square shape. That is, n pixels Xij are one-dimensionally arranged along a vertical direction in each of a plurality of columns, and m pixels Xij are one-dimensionally arranged along a horizontal direction in each of a plurality of rows. Then, a horizontal scanning circuit 6 is provided along a pixel row in the horizontal direction of the plurality of pixels Xij in the vicinity of the pixel array portion 5, and a vertical scanning circuit 7 is provided along a pixel column in the vertical direction of the plurality of pixels Xij. A timing generation circuit (a clock input unit) 8 is connected to the horizontal scanning circuit 6 and the vertical scanning circuit 7. In addition, the timing generation circuit 8 is connected to the respective pixels Xij through a clock supply line including a column skew correction circuit 12.

The pixels Xij in the pixel array portion 5 are sequentially scanned by the timing generation circuit 8, the horizontal scanning circuit 6, and the vertical scanning circuit 7, and pixel signals are read or initialized. That is, the pixel array portion 5 is scanned by the vertical scanning circuit 7 in the vertical direction in a unit of pixel row, so that the pixel signal of each pixel column contained in the scanned pixel columns is read by a vertical signal line provided for each pixel column. The reading of the pixel signal of each pixel column is performed by outputting the signal through a noise cancel circuit 9 and an output buffer circuit 10 provided for each vertical signal line. Furthermore, when the pixel signal of each pixel column is read, the scanning of the pixels Xij is performed in the horizontal direction by the horizontal scanning circuit 6. The timing generation circuit 8 performs a control on timing of vertical scanning and horizontal scanning of the pixels Xij of the pixel array portion 5 as described above. Further, the timing generation circuit performs a control on timing of emitting the pulse light of the laser light source 3 provided in the measurement system 100 and a control on timing of charge accumulation and charge discharge in each pixel Xij on the basis of the timing of emitting the pulse light according to a control pulse voltage TW given to each pixel Xij.

Figure 3:
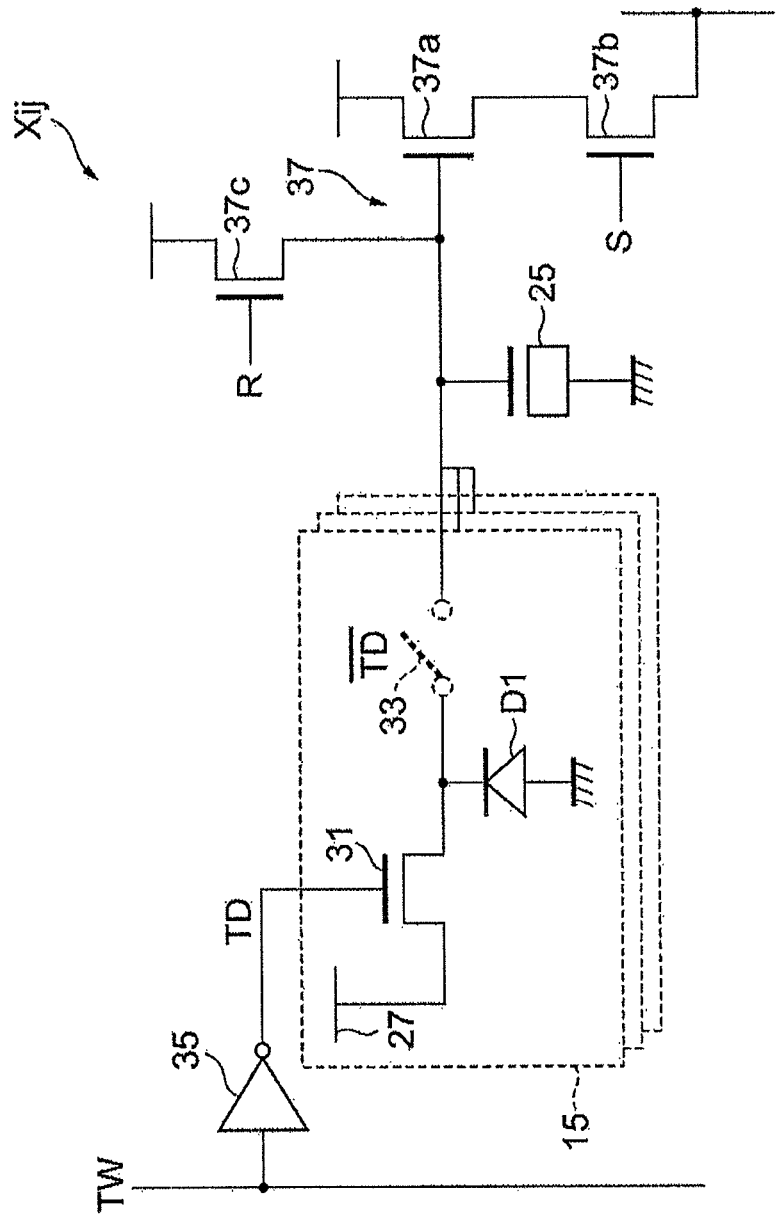
FIG. 3 is a circuit diagram illustrating a configuration of a pixel Xij in a pixel array portion 5 of FIG. 2.
Figure 4:
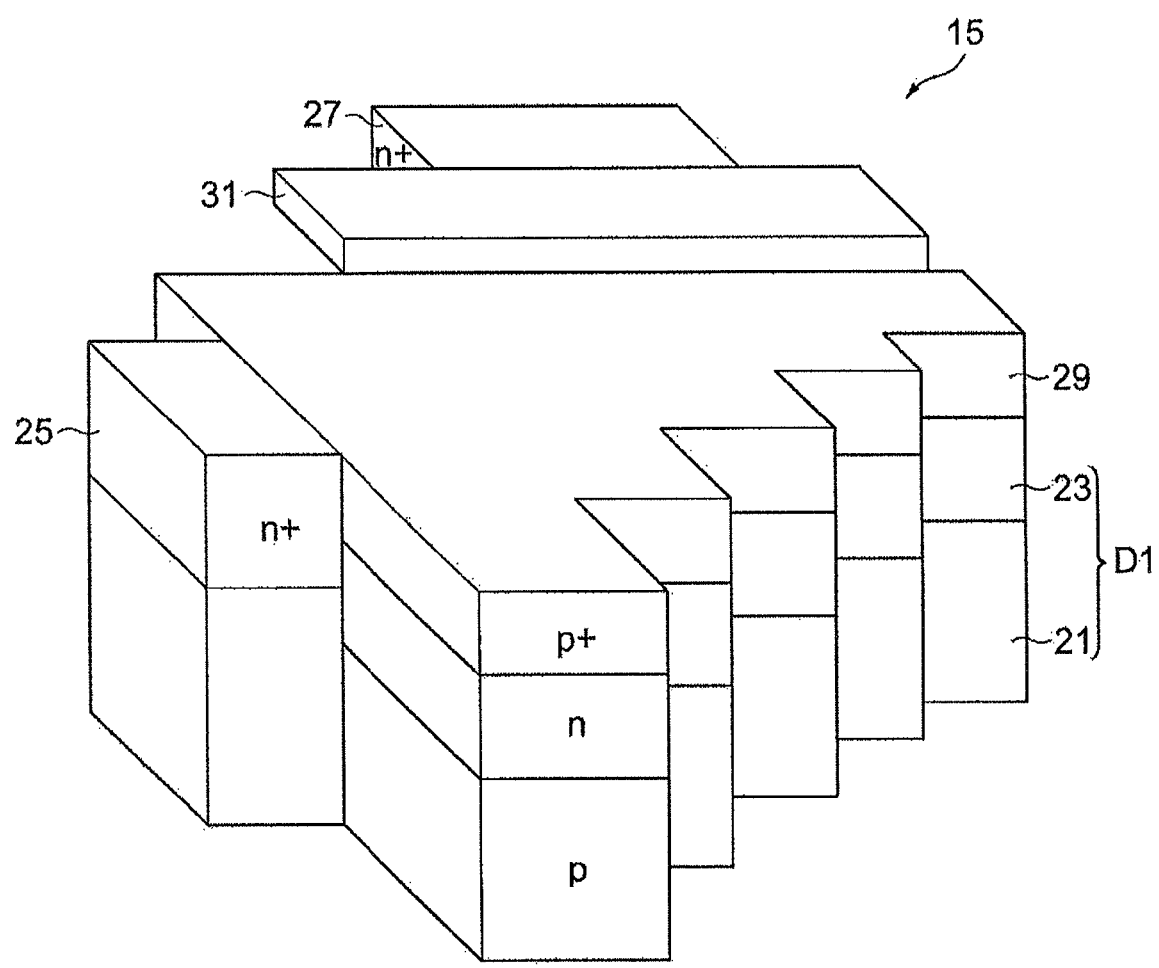
FIG. 4 is a perspective view illustrating a layered structure of a semiconductor element 15 provided in the pixel Xij of FIG. 3.

FIG. 3 is a circuit diagram illustrating a configuration of the pixel Xij in the pixel array portion 5. FIG. 4 is a perspective view illustrating a layered structure of a semiconductor element 15 provided in the pixel Xij. As illustrated in these drawings, a plurality of semiconductor elements 15 each serving as a pixel circuit are arranged in the pixel Xij. The semiconductor element 15 includes a semiconductor region 21 of a first conductive type (p type), a light-receiving surface embedded region (the light-receiver) 23 of a second conductive type (n type) which is embedded in a part of the upper portion of the semiconductor region 21 and on which the light is incident, a charge accumulation region (a charge accumulation unit) 25 of the second conductive type (n type) which is provided adjacent to the light-receiving surface embedded region (the light-receiver) 23 in a part of the upper portion of the semiconductor region 21 and accumulates the charges generated by the light-receiving surface embedded region (the light-receiver) 23, and a discharge drain region (a charge discharge portion) 27 of the second conductive type ($n^+$ type) which is separately embedded in the vicinity of the light-receiving surface embedded region 23 in a part of the upper portion of the semiconductor region 21. The discharge drain region 27 is a portion for discharging electrons generated in the light-receiving surface embedded region 23, and is provided in the vicinity of a boundary which is intersected almost vertically with a boundary between the light-receiving surface embedded region 23 and the charge accumulation region 25. The light-receiving surface embedded region 23 and the semiconductor region 21 immediately below the region form the embedded photodiode D1 which converts the reflected light (incident light) from the target Sa into charges (electrons). Further, an epitaxial layer of the first conductive type having an impurity concentration lower than that of a semiconductor substrate formed on a semiconductor substrate of the first conductive type may be used in place of the semiconductor region 21 of the first conductive type.

In addition, a $p^+$ type pinning layer 29 is further disposed in the upper portion of the light-receiving surface embedded region 23 of the semiconductor element 15. The pinning layer 29 is a layer used to suppress the charges from being generated in the surface of the embedded photodiode D1 at dark, and may be provided in order to cancel a dark current. In an application where the dark current does not cause a problem, the pinning layer 29 may be omitted. Furthermore, a gate electrode 31 used for controlling the discharge of charges from the embedded photodiode D1 to the discharge drain region 27 is formed between the embedded photodiode D1 and the discharge drain region 27 on the semiconductor region 21 by controlling a potential of a transfer channel formed between the embedded photodiode D1 and the discharge drain region 27.

Figure 5A:
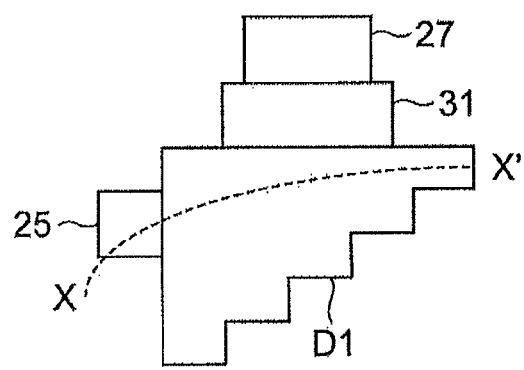
FIG. 5A is a diagram illustrating a potential distribution in a cross section when a voltage is applied to a gate electrode 31 in the semiconductor element 15 of FIG. 4.
Figure 5A:
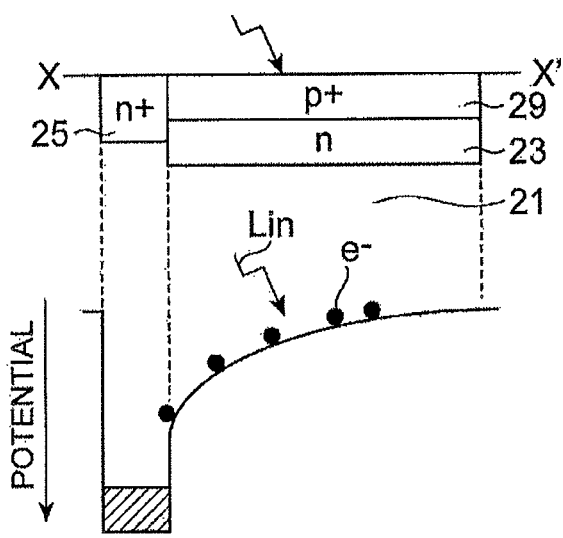
Figure 5B:
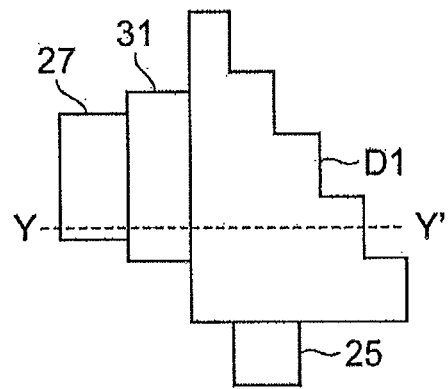
FIG. 5B is a diagram illustrating a potential distribution in a cross section when a voltage is applied to a gate electrode 31 in the semiconductor element 15 of FIG. 4.
Figure 5B:
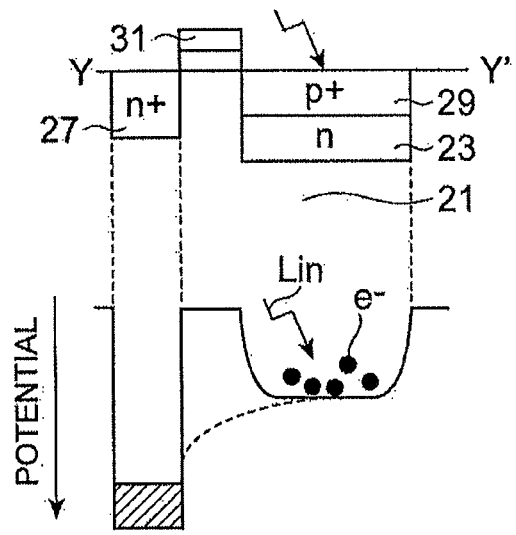

FIGS. 5A and 5B illustrate a potential distribution in the cross section of the semiconductor element 15 when a voltage is applied to the gate electrode 31. Specifically, FIG. 5A illustrates a potential distribution in the cross section taken along a line X-X' from a region of the embedded photodiode D1 to the charge accumulation region 25, in which a potential gradient is formed from the region of the embedded photodiode D1 to the charge accumulation region 25. In addition, FIG. 5B illustrates a potential distribution in the cross section taken along a line Y-Y' from the region of the embedded photodiode D1 to the discharge drain region 27, in which the solid line shows a distribution when a low voltage is applied to the gate electrode 31 and the dotted line shows a distribution when a high voltage is applied to the gate electrode 31. In this way, since a potential barrier is formed between the region of the embedded photodiode D1 and the discharge drain region 27 when the low voltage is applied to the gate electrode 31, the transfer channel between the region of the embedded photodiode D1 and the discharge drain region 27 is closed. Therefore, all the electrons $e^-$ generated in accordance with the incident light $L_{in}$ are transferred to the charge accumulation region 25. In contrast, since the potential barrier disappears between the region of the embedded photodiode D1 and the discharge drain region 27 when the high voltage is applied to the gate electrode 31 and thus the potential gradient is formed, the transfer channel between the region of the embedded photodiode D1 and the discharge drain region 27 is opened. Therefore, all the electrons e generated in accordance with the incident light $L_{in}$ are transferred to the discharge drain region 27. That is, when the high voltage is applied to the gate electrode 31, a charge transfer effect of the transfer channel between the region of the embedded photodiode D1 and the discharge drain region 27 is dominant compared to the charge transfer effect between the region of the embedded photodiode D1 and the charge accumulation region 25. Therefore, all the generated electrons e⁻ are transferred to the discharge drain region 27. In this way, the gate electrode 31 has also a function of a virtual switch 33 for controlling the transfer of charges from the embedded photodiode D1 to the charge accumulation region 25.

Returning to FIG. 3, in the pixel Xij, there is further provided a buffer circuit 35 which inverts the control pulse voltage TW applied from the timing generation circuit 8 and applies the inverted voltage (a control pulse voltage TD) to the gate electrode 31. Specifically, the buffer circuit 35 is an inverter circuit. With the buffer circuit 35, a load to be directly connected to the gate electrode 31 of the pixel Xij can be lowered, and a degradation of the waveform of the control pulse voltage TW can be prevented.

Furthermore, in the pixel Xij, there is provided a read circuit (charge read unit) 37 which reads the charges (an electrical signal) accumulated in the charge accumulation region 25 in accordance with the application of the control pulse voltage TW. The read circuit 37 is configured to include a signal-reading transistor 37a, a switching transistor 37b, and a reset transistor 37c. The gate electrode of the signal-reading transistor 37a is connected to the charge accumulation region 25, the drain electrode of the signal-reading transistor 37a is connected to a bias power supply, and the source electrode of the signal-reading transistor 37a is connected to the drain electrode of the switching transistor 37b for selecting a pixel. The source electrode of the switching transistor 37b is connected to the vertical signal line, and a control signal S for selecting a pixel column is applied from the vertical scanning circuit 7 to the gate electrode of the switching transistor 37b. The switching transistor 37b is electrically connected by setting the control signal S for selection to a high level, and an electrical signal which is amplified by the signal-reading transistor 37a and has a potential corresponding to the amount of charges accumulated in the charge accumulation region 25 is output to the vertical signal line. The reset transistor 37c is configured such that the source electrode thereof is connected to the charge accumulation region 25, and the drain electrode thereof is connected to the bias power supply, and a reset signal R is applied from the vertical scanning circuit 7 to the gate electrode thereof. The reset transistor 37c discharges the charges accumulated in the charge accumulation region 25 when the reset signal R is set to a high level, and thus resets the charge accumulation region 25.

Figure 6:
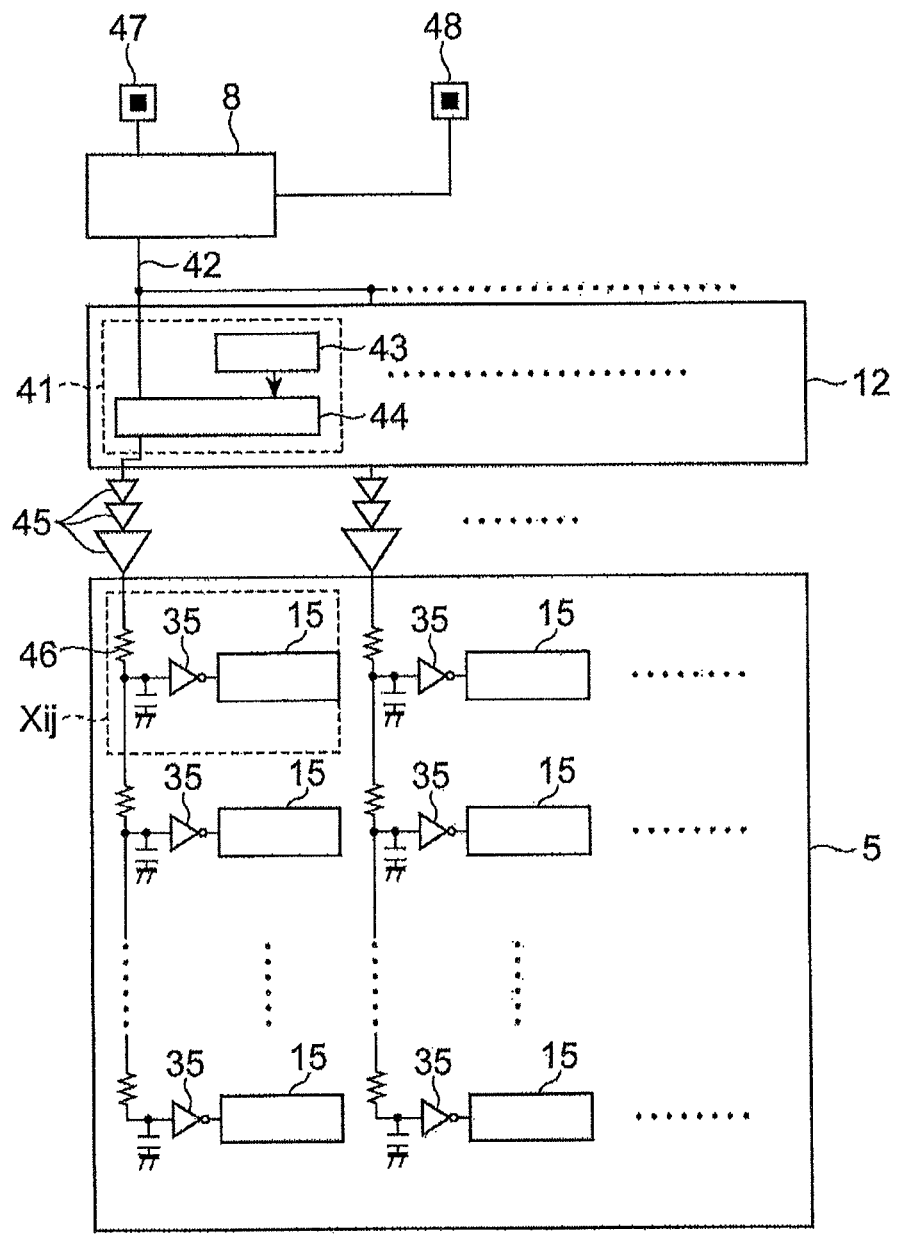
FIG. 6 is a circuit diagram illustrating a connection structure between each pixel Xij in the pixel array portion 5 of FIG. 2 and a timing generation circuit 8.

In FIG. 6, a connection structure between each pixel Xij in the pixel array portion 5 and the timing generation circuit 8 is illustrated in detail. As illustrated in the drawing, the timing generation circuit 8 and the pixel array portion 5 are connected through the column skew correction circuit 12.

In detail, the column skew correction circuit 12 is configured to include a plurality of correction circuit units (a first delay adjustment unit) 41 which are provided in correspondence with the columns of the plurality of pixels Xij of the pixel array portion 5. Each correction circuit unit 41 is configured by a delay adjustment circuit 44 which is connected to the timing generation circuit 8 through a clock supply line 42, and a memory (a storage unit) 43. The memory 43 stores a digital value therein to determine a delay time for delaying the control pulse voltage TW supplied from the timing generation circuit 8. In addition, the delay adjustment circuit 44 is connected to the clock supply line 42 and all the pixels Xij of the corresponding pixel column, delays the control pulse voltage TW supplied from the timing generation circuit 8 in a variable time according to the digital value read from the memory 43, and applies the control pulse voltage TW to the gate electrodes 31 of all the pixels Xij belonging to the corresponding column. The timing generation circuit 8 is a PLL (Phase Locked Loop) circuit which is supplied with clocks from an input terminal 47 and generates the control pulse voltage TW on the basis of the clocks. In addition, the timing generation circuit 8 generates a trigger signal to control a timing of emitting the pulse light of the laser light source 3, and outputs the trigger signal from an output terminal 48. The timing generation circuit 8 is a PLL circuit to generate the clocks, but not necessarily be the PLL in this embodiment. Any circuit may be employed as long as the circuit receives the clocks from an external input and inputs the control pulse voltage TW to the pixel Xij on the basis of the clocks.

Herein, the delay adjustment circuit 44 is connected to the gate electrode 31 of the semiconductor element 15 through a plurality of buffer circuits 45, and a wiring resistor 46 and the buffer circuit 35 in each pixel Xij. The buffer circuit 45 is used to drive the plurality of buffer circuits 35 connected to each pixel column, and a plurality of buffer circuits are connected in series for each pixel column. The buffer circuit 35 is used to shape the waveform of the clock to be supplied to the semiconductor element 15, and to lower a load directly connected to the buffer circuit 45.

The column skew correction circuit 12 configured as described above is provided in order to eliminate a time skew of the control pulse voltage TW which occurs between the pixel columns in the plurality of pixels Xij. The skew of the control pulse voltage TW between the pixel columns is caused by a difference in performance due to a manufacturing variation of the buffer circuit 45, and a delay time in the clock supply line due to a difference in power voltage drop. Each correction circuit unit 41 in the column skew correction circuit 12 sets the delay time of the control pulse voltage TW to be supplied to each pixel column such that the skew of the control pulse voltage TW caused between the pixel columns is cancelled. That is, the correction circuit unit 41 in the column skew correction circuit 12 changes a signal delay characteristic of the clock supply line between the timing generation circuit 8 and each pixel column.

Figure 7:
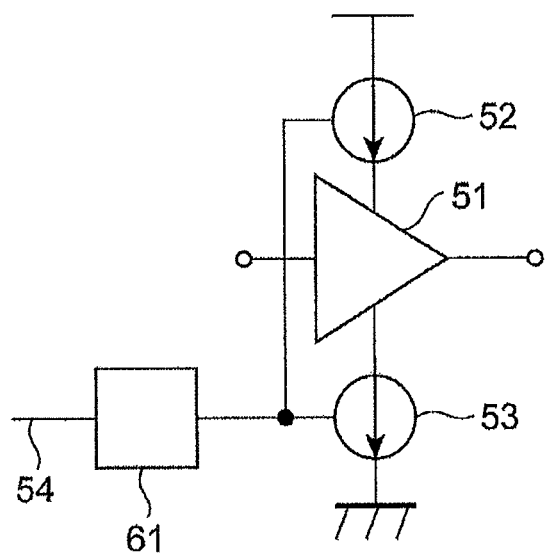
FIG. 7 is a circuit diagram illustrating an exemplary configuration of a delay adjustment circuit 44 of a correction circuit unit 41 of FIG. 6.
Figure 8:
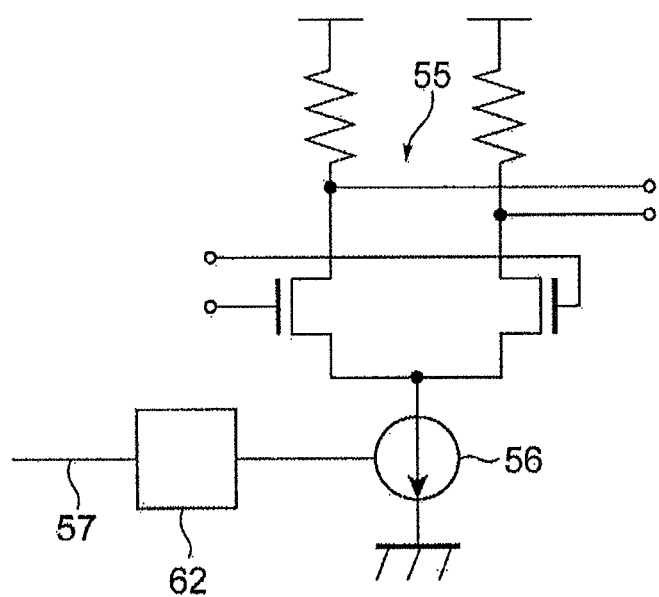
FIG. 8 is a circuit diagram illustrating an exemplary configuration of the delay adjustment circuit 44 of the correction circuit unit 41 of FIG. 6.
Figure 9:
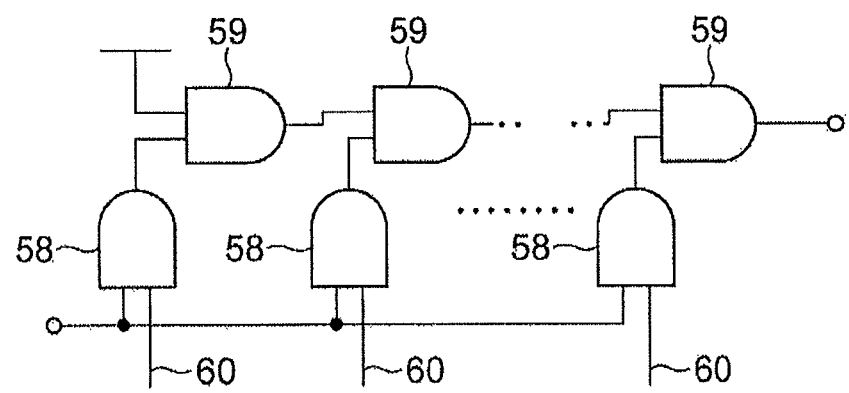
FIG. 9 is a circuit diagram illustrating an exemplary configuration of the delay adjustment circuit 44 of the correction circuit unit 41 of FIG. 6.

In FIGS. 7 to 9, an exemplary configuration of the delay adjustment circuit 44 of the correction circuit unit 41 is illustrated. For example, the delay adjustment circuit 44 is configured, as illustrated in FIG. 7, to include a single-ended amplifier 51, current sources 52 and 53 which drive the single-ended amplifier 51, and a digital/analog (D/A) converter 61 which converts an adjustment bit into a voltage value. The delay adjustment circuit can change the signal delay characteristic by adjusting the current values of the current sources 52 and 53 using a control signal given to an adjustment bit line 54. In addition, the delay adjustment circuit 44 is configured, as illustrated in FIG. 8, to include a differential amplifier 55, a current source 56 which drives the differential amplifier 55, and a digital/analog (D/A) converter 62 which converts the adjustment bit into a voltage value. The delay adjustment circuit can change the signal delay characteristic by adjusting the current value of the current source 56 using a control signal given to an adjustment bit line 57. Furthermore, the delay adjustment circuit 44 may be a digital delay element as illustrated in FIG. 9. That is, circuits each configured by combining a set of AND gates 58 and 59 are connected in series. In each AND gate 58, the control pulse voltage TW is input to one input terminal, and a control bit is input to the other input terminal through an adjustment bit line 60. In each AND gate 59, the output of the AND gate 59 at the previous stage is sequentially input to one input terminal, and the output of the paired AND gate 58 is input to the other input terminal. According to such a configuration, it is possible to output the control pulse voltage TW of which the delay time is adjusted.

A calculation circuit (a calculation unit) 11 illustrated in FIG. 2 calculates a distance up to the target Sa on the basis of the electrical signal read from the pixel Xij under the timing control of the timing generation circuit 8.

Figure 10A:
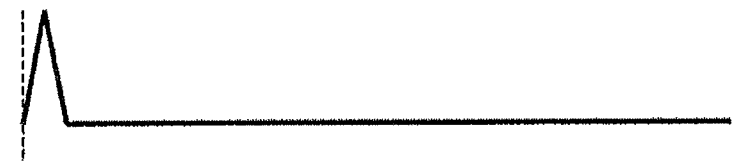
FIG. 10A is a time waveform of the pulse light which is emitted from the laser light source.
Figure 10B:
FIG. 10B is a time waveform of the reflected light which is received by the pixel.
Figure 10C:
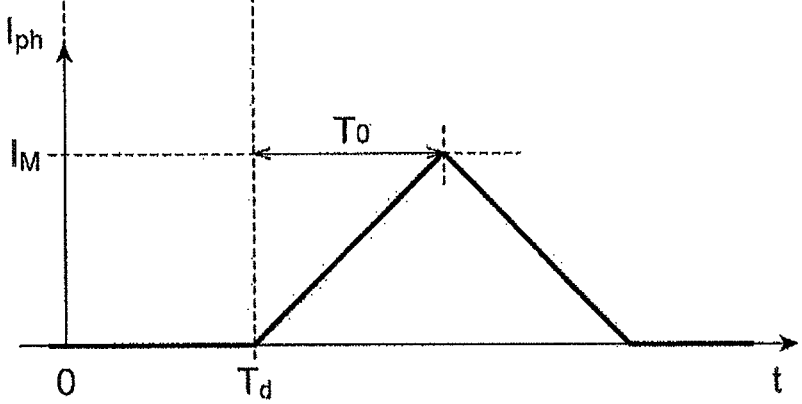
FIG. 10C is a time waveform of a photocurrent which indicates a response characteristic with respect to the reflected light of the pixel.
Figure 10D:
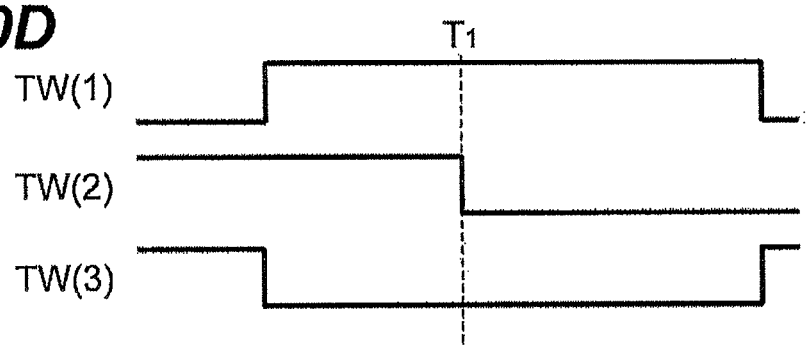
FIG. 10D is a time waveform of the control pulse voltage which is applied to the gate electrode of the pixel.

Hereinafter, a sequence of a distance calculation operation of the timing generation circuit 8 and the calculation circuit 11 will be described. FIGS. 10A to 10D are timing charts illustrating a light-emitting timing and a charge accumulation timing controlled by the timing generation circuit 8. FIG. 10A is a time waveform of the pulse light which is emitted from the laser light source 3. FIG. 10B is a time waveform of the reflected light which is received by the pixel Xij. FIG. 10C is a time waveform of a photocurrent $I_{ph}$ which indicates a response characteristic with respect to the reflected light of the pixel Xij. FIG. 10D is a time waveform of the control pulse voltage TW which is applied to the gate electrode 31 of the pixel Xij.

First, a light-emitting timing is determined by the timing generation circuit 8 so as to repeatedly emit the light at a predetermined frequency. The trigger signal is supplied from the timing generation circuit 8 such that the laser light source 3 emits the pulse light at the light-emitting timing. Accordingly, the reflected light is incident on the pixel Xij at a time difference $t_d$ corresponding to the distance up to the target Sa after the light-emitting timing. Herein, a pulse width of the reflected light to be incident on the pixel Xij is set to a value (for example, a pulse width of 100 psec or less) sufficiently shorter than the response time of the light-receiver of the pixel Xij. As a result, a response waveform with respect to the incident light in the light-receiver of the pixel Xij becomes almost the same as an impulse response. That is, the response waveform becomes a substantially triangular waveform which rises from the incident time $t_d$ of the reflected light based on the light-emitting timing up to a maximum value $I_M$ at a response time $T_0$ of the light-receiver and then falls to the response time $T_0$.

The timing generation circuit 8 is controlled to repeatedly generate the control pulse voltages TW(1), TW(2), and TW(3) having three types of phase differences in correspondence with the response waveform of the pixel Xij. Specifically, the control pulse voltage TW(1) is set to a rectangular pulse wave which becomes the high level only a predetermined period after the light-emitting timing. In addition, the control pulse voltage TW(2) is set to a rectangular pulse wave which becomes the high level from the light-emitting timing to a time $T_1$ after the light-emitting timing, and the control pulse voltage TW(1) is partially overlapped with the high level section. In addition, the control pulse voltage TW(3) is set to a rectangular pulse wave obtained by inverting the control pulse voltage TW(1).

In this way, the control pulse voltage TW(1) is controlled to be repeatedly applied after the light-emitting timing by the timing generation circuit 8, and then a first charge accumulated in the charge accumulation region 25 is read as a first electrical signal in accordance with the application of the control pulse voltage TW(1) from the pixel Xij. In addition, the control pulse voltage TW(2) is controlled to be repeatedly applied after the light-emitting timing by the timing generation circuit 8, and then a second charge accumulated in the charge accumulation region 25 is read as a second electrical signal in accordance with the application of the control pulse voltage TW(2) from the pixel Xij. Similarly, the control pulse voltage TW(3) is controlled to be repeatedly applied after the light-emitting timing by the timing generation circuit 8, and then a third charge accumulated in the charge accumulation region 25 is read as a third electrical signal in accordance with the application of the control pulse voltage TW(3) from the pixel Xij.

Thereafter, the calculation circuit 11 normalizes the values of the read first to third electrical signals and converts the values into the numbers $N_1$, $N_2$, and $N_3$ of accumulated charges. Herein, an impulse response waveform of the photocurrent of the pixel Xij is approximated by a linear function shown in the following Equation (1).

[Mathematical Formula 1]

$$I_{ph} = \begin{cases} 0 & (t < t_d) \\ \frac{I_M}{T_0}(t - t_d) & (t_d \leq t < T_0 + t_d) \\ I_M - \frac{I_M}{T_0}(t - t_d - T_0) & (T_0 + t_d \leq t < 2T_0 + t_d) \end{cases} \quad (1)$$

According to the linear function, the numbers of electrons accumulated in accordance with the application of the control pulse voltages TW(1), TW(2), and TW(3) may be ideally calculated by the following Equation (2) when the time difference $t_d$ falls within a range of $T_1 - T_0 < t_d \leq T_1$.

[Mathematical Formula 2]

$$\begin{aligned} N_1 &= \int_{t_d}^{t_d + 2T_0} \frac{I_M}{qT_0}(t - t_d)dt \\ &= \frac{I_M \cdot T_0}{q} \\ N_2 &= \int_{t_d}^{T_1} \frac{I_M}{qT_0}(t - t_d)dt \\ &= \frac{I_M}{2qT_0}(T_1 - t_d)^2 \\ N_3 &= 0 \end{aligned} \quad (2)$$

Herein, using the relation of the above Equation (2), the calculation circuit 11 calculates the time difference $t_d$ (light traveling time) using the following Equation (3). At this time, the calculation circuit 11 calculates a ratio r of the values obtained by correcting the number of accumulated charges $N_1$ and $N_2$ using the number of accumulated charges $N_3$.

[Mathematical Formula 3]

$$t_d = T_1 - T_0\sqrt{2r} \quad (3)$$
$$r = \frac{N_2 - N_3}{N_1 - N_3}$$

Furthermore, the calculation circuit 11 calculates and outputs a distance L up to the target Sa on the basis of the calculated time difference $t_d$ using the following Equation (4), in which c [m/s] is the speed of light.

[Mathematical Formula 4]

$$L = \frac{c}{2}\left(T_1 - \sqrt{2r}\,T_0\right) \quad (4)$$

Further, the range of the distance L which is measurable by the above Equation (4) becomes a range of the value calculated by the following Equation (5), and is proportional to the response time $T_0$ of the impulse response of the pixel Xij.

[Mathematical Formula 5]

$$\frac{c}{2}T_0 \quad \left(\frac{c}{2}(T_1 - T_0) < L \le \frac{c}{2}T_1\right) \quad (5)$$

In addition, a resolution $\sigma_L$ of the distance L which is measurable in a state where a short noise is dominant becomes a value calculated by the following Equation (6). The resolution is inversely proportional to a square root of the number of accumulated charges $N_1$, and is proportional to the response time $T_0$ of the impulse response of the pixel Xij. For example, in a case where the number of accumulated charges $N_1 = 10^6$, the response time $T_0 = 100$ psec, and an available parameter r is set to 0 to 0.5, a range of the measurable distance L is 15 mm, and the measurable resolution $\sigma_L$ is 10.6 μm to 13 μm.

[Mathematical Formula 6]

$$\sigma_L = \frac{cT_0}{2}\sqrt{\frac{1+r}{2N_1}} \quad (6)$$

Next, the description will be made about a method of setting the digital value stored in the memory 43 of the correction circuit unit 41.

As described above, when the delay of the light-emitting timing of the pulse light is changed, the output of the number of accumulated charges $N_2$ is changed. Since a differential value of the output value $N_2$ is equivalent to the photocurrent $I_{ph}$, the output value $N_2$ is acquired while changing the delay time of the light-emitting timing in each pixel Xij. Further, the digital value of the memory 43 is selected for each pixel column by measuring a delay time $t_{peak}(i, j, D_c)$ ($D_c$: the digital value which is set in the memory 43) at which the differential value is maximized due to a modulation characteristic of the output value $N_2$. Further, the modulation characteristic can be obtained by changing a delay amount of the control pulse voltage TW(2).

For example, in a case where the input to the camera device 1 is assumed as a direct light from the light source which is at an equal distance from all the pixels, or the reflected light of an object which is at an equal distance from all the pixels, and the digital value of the memory of the correction circuit unit 41 is set to an initial value DC0, a deviation in a delay time $t_{peak}(i, j, D_{c0})$ between the pixels Xij becomes equivalent to the skew $\Delta T_1(i, j, D_{c0})$. Then, when the digital value of the memory 43 is changed, the delay time $t_{peak}(i, j, D_c)$ is changed according to the delay amount of the control pulse voltage TW(2), the digital value of the memory 43 for each pixel column can be determined from the measured delay time $t_{peak}(i, j, D_c)$.

In detail, $T_1$ in the above Equation (4) is actually set to be different values for the pixels due to the clock skew. With this regard, the distance L(i, j) calculated with respect to the pixel Xij is calculated by the following Equation (7).

[Mathematical Formula 7]

$$L(i, j) = \frac{c}{2}\left(T_1(i, j) - T_0\sqrt{2r(i, j)}\right) \quad (7)$$
$$\frac{c}{2}\left(T_{1,max} - \Delta T_i(i, j) - T_0\sqrt{2r(i, j)}\right)$$

Herein, $T_{1,max}$ is a value given by the following Equation (8) which shows the value $T_1$ of the most-delayed pixel Xij.

[Mathematical Formula 8]

$$T_{1,max} = \max[T_1(i,j)] \quad (8)$$

In addition, the skew $\Delta T_1(i, j, D_{c0})$ is an amount deviated from $T_{1,max}$ (that is, a skew between the correction target pixels). As can be seen from the above Equation (7), an error occurs in the calculated distance even when the object is positioned in an equal distance from all the pixels Xij due to the skew. When the skew is large, some pixels Xij are out of a measurement range, and thus it is not possible to measure the distances in all the pixels Xij. Therefore, there is a need to correct the skew in the pixel array portion 5.

As described in this embodiment, in a case where the correction circuit unit 41 is provided for each column, a digital value $D_c$ of the memory 43 can be set for each column. The distance is calculated by the following Equation (9).

[Mathematical Formula 9]

$$L_{cali}(i, j, D_c) = \frac{c}{2}(T'_{1,max} - \Delta T_1(i, j, D_{c0}) + \quad (9)$$
$$t_{cali\_skew}(j, D_c) + t_{cali\_dig}(i, j) - T_0\sqrt{2r(i, j)}\,)$$

Herein, $D_{c0}$ is an initial value of the digital value of the memory 43, and $T_1$ of the most-delayed pixel Xij is given by the following Equation (10).

[Mathematical Formula 10]

$$T'_{1,max} = \max[T_1(i,j,D_{c0})] \quad (10)$$

An adjustment value $t_{cali\_skew}(j, D_c)$ is the delay amount of the correction circuit unit 41 at the digital value $D_c$ and becomes the same value for each column. In addition, the adjustment value $t_{cali\_dig}(i, j)$ is a delay adjustment value in digital correction, and can be independently set for each pixel.

In this embodiment, the digital value $D_c$ is set to satisfy the following Equation (11) in order to minimize the skew between the columns,

[Mathematical Formula 11]

$$D_c = \mathrm{argmin}\left[\frac{1}{N_R}\sum_{i=0}^{N_R-1}\Delta T_1(i, j, D_{c0}) - t_{cali\_skew}(j, D_c)\right] \quad (11)$$

Herein, $N_R$ is the number of pixels Xij in the vertical direction. The adjustment value $t_{cali\_skew}(j, D_c)$ has a resolution which is determined by the number of bits of the memory 43, and a correction error occurs to some degrees in order to correct only the skew between the columns. The correction error is corrected in a digital region. That is, the adjustment value $t_{cali\_dig}(i, j)$ is set to be the value calculated by the following Equation (12), so that a distance error between the pixels due to the skew is removed.

[Mathematical Formula 12]

$$\Delta T_1(i,j,D_{c0}) - (t_{cali\_skew}(j,D_c) + t_{cali\_dig}(i,j)) = 0 \quad (12)$$

Herein, the delay time at which the differential value is maximized is obtained from the modulation characteristic of the output value $N_2$ in the above setting method. As another method, the direct light of a light source at an equal distance from all the pixels or the reflected light of an object at an equal distance from all the pixels are received as an input to the camera device 1, and the digital value $D_c$ may be selected at which the output value $N_2$ becomes equal in all the pixels, in a state where quantity of light in each pixel Xij is constant.

According to the camera device 1 described above, the transfer timing of the charges from the light-receiving surface embedded region 23 to the charge accumulation region 25 in each pixel Xij and the transfer timing of the charges from the light-receiving surface embedded region 23 to the discharge drain region 27 are controlled by applying the control pulse voltage TW from the timing generation circuit 8 to the gate electrodes 31 of the plurality of pixels Xij arranged in the plurality of columns. At this time, the control pulse voltage TW applied to each pixel Xij passes through the correction circuit unit 41 provided in the plurality of columns of the pixels Xij and thus the delay time is variably set to each column. Therefore, it is possible to cancel a difference in transfer delay of each column which is easily generated by a characteristic difference of the buffer circuit 45 provided between the timing generation circuit 8 and the pixel Xij, and the skew of the control signal between the columns of the pixels Xij can be prevented. As a result, a high-accurate imaging increased in time resolution can be made.

In addition, the correction circuit unit 41 can change the signal delay characteristic for each column between the timing generation circuit 8 and each column of the pixels Xij by adjusting the value stored in the memory 43. Therefore, the skew (the difference in delay time) between the columns of the pixels Xij can be easily cancelled.

Figure 11A:
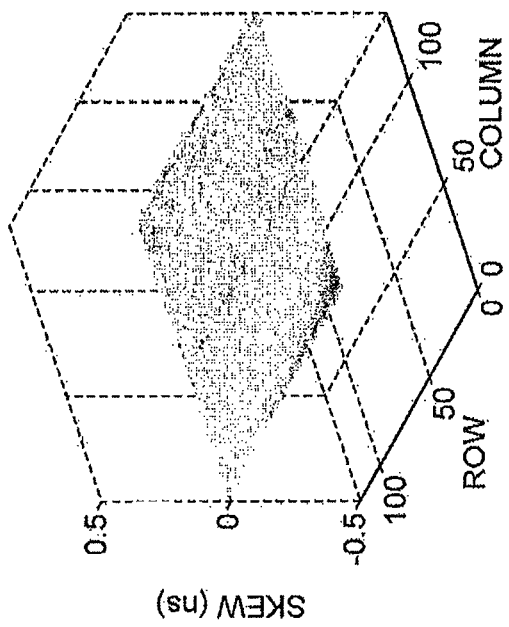
FIG. 11A is a graph illustrating a measurement result of a skew generated by the pixel array portion 5 of the camera device 1 according to this embodiment.
Figure 11A:
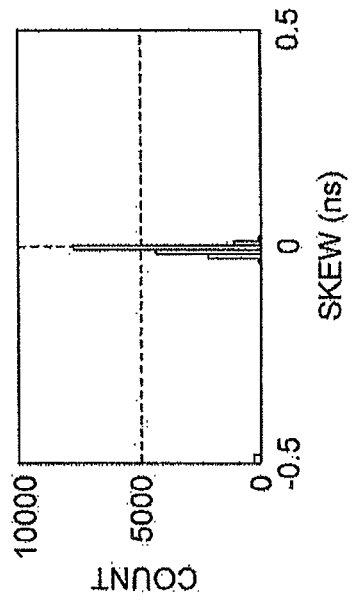
Figure 11B:
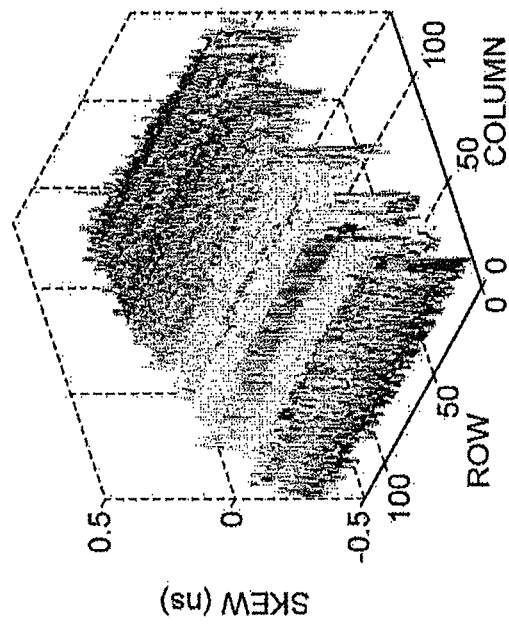
FIG. 11B is a graph illustrating a measurement result of a skew generated by the pixel array portion 5 of the camera device 1 according to this embodiment.
Figure 11B:
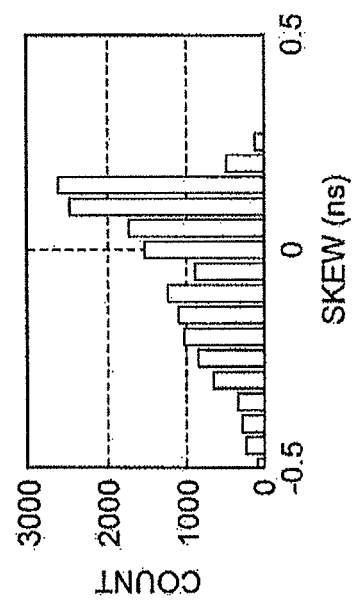

FIGS. 11A and 11B illustrate a measurement result of the skew generated in the pixel array portion 5 of the camera device 1 according to this embodiment. FIG. 11A illustrates a measurement result in a comparative example in which the column skew correction circuit 12 is not provided. FIG. 11B illustrates a measurement result of this embodiment in which the column skew correction circuit 12 is provided. From these results, in the camera device 1 of this embodiment, it can be seen that the skew in all the pixels Xij contained in the pixel array portion 5 is effectively reduced. In particular, the skew between the columns of the pixels in a case where the column skew correction circuit 12 is not provided apparently occurs, but the skew between the columns are substantially cancelled in this embodiment.

Further, the invention is not limited to the above embodiments.

Figure 12:
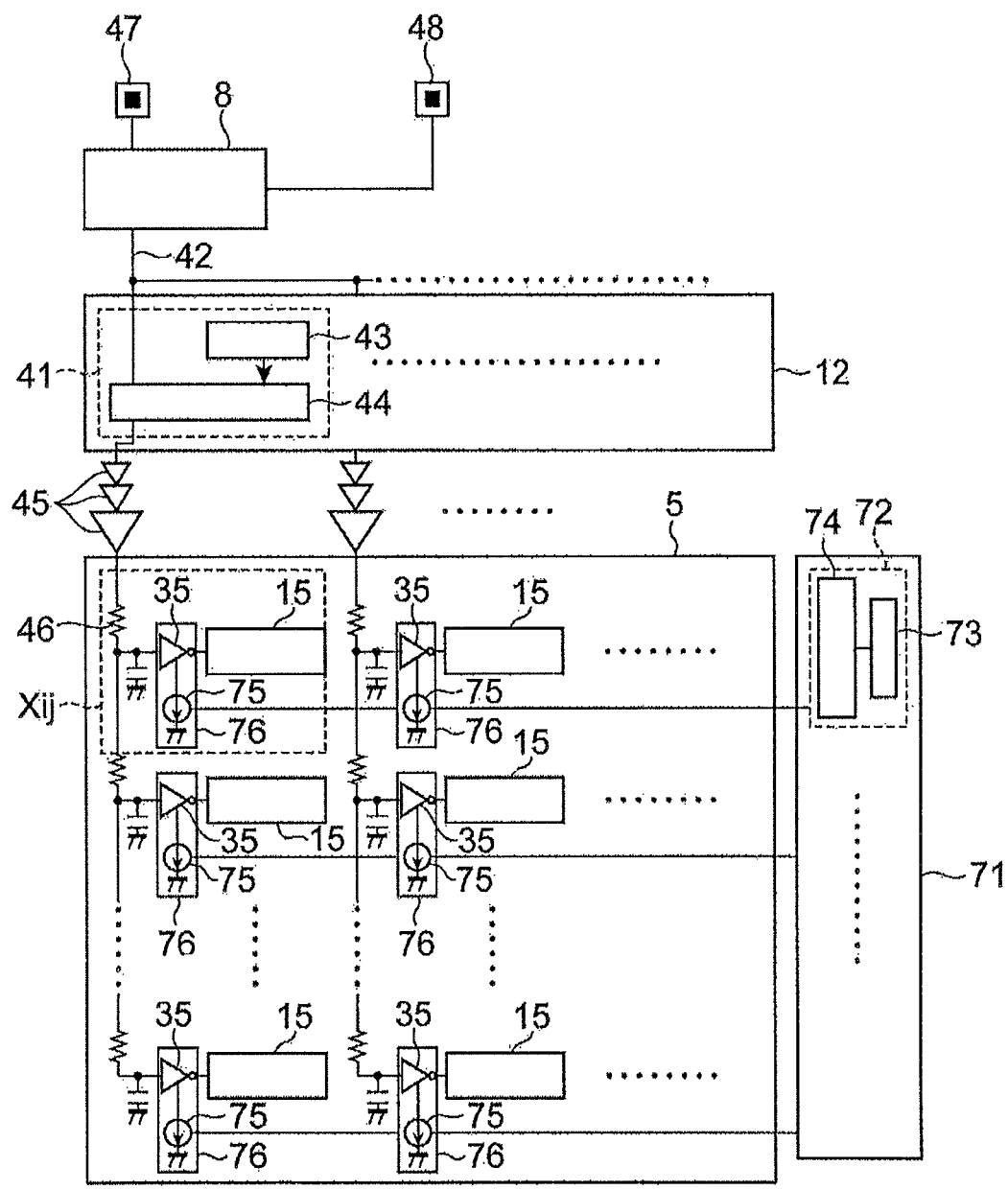
FIG. 12 is a circuit diagram illustrating a connection structure between each pixel Xij in the pixel array portion 5 in a modification of the invention and the timing generation circuit 8.

For example, FIG. 12 illustrates a connection structure between each pixel Xij in the pixel array portion 5 in a modification of the invention and the timing generation circuit 8. The modification is further provided with a row skew correction circuit 71 in addition to the column skew correction circuit 12. The row skew correction circuit 71 includes a plurality of correction circuit units (second delay adjustment units) 72 which are provided in correspondence with a plurality of rows of the pixels Xij. Each of the correction circuit units 72 includes a memory 73 which stores a digital value for determining the delay time in each pixel row, and a D/A converter 74 which converts the digital value read from the memory 73 into an analog value. In addition, a current source 75 for driving the buffer circuit 35 connected to the D/A converter 74 is provided for each pixel Xij. The current source 75 and the buffer circuit 35 form a delay adjustment circuit 76 which changes the delay time of the control pulse voltage TW supplied from the timing generation circuit 8 for each row. According to such a modification, the signal delay characteristic between the timing generation circuit 8 and each pixel Xij can be adjusted for each pixel row according to the digital value stored in the memory 73 of the correction circuit unit 72. Therefore, the control pulse voltage TW supplied from the timing generation circuit 8 can be delayed in a variable time for each of the plurality of pixel rows. The control pulse voltage TW can be applied to the gate electrode 31 of the pixel Xij.

According to the configuration illustrated in FIG. 12, it is possible to cancel the difference in transfer delay for each row caused by a parasitic element of the clock supply line between the timing generation circuit 8 and the pixel Xij. The skew of the control pulse voltage TW between the rows of the pixels Xij can be prevented from occurring. As a result, a high-accurate imaging more increased in time resolution can be made. Furthermore, the signal delay characteristic of the delay adjustment circuit 76 can be changed for each row by adjusting the value stored in the memory 73 of the correction circuit unit 72. Therefore, the difference in transfer delay for each row of the pixels Xij can be easily cancelled.

Figure 13:
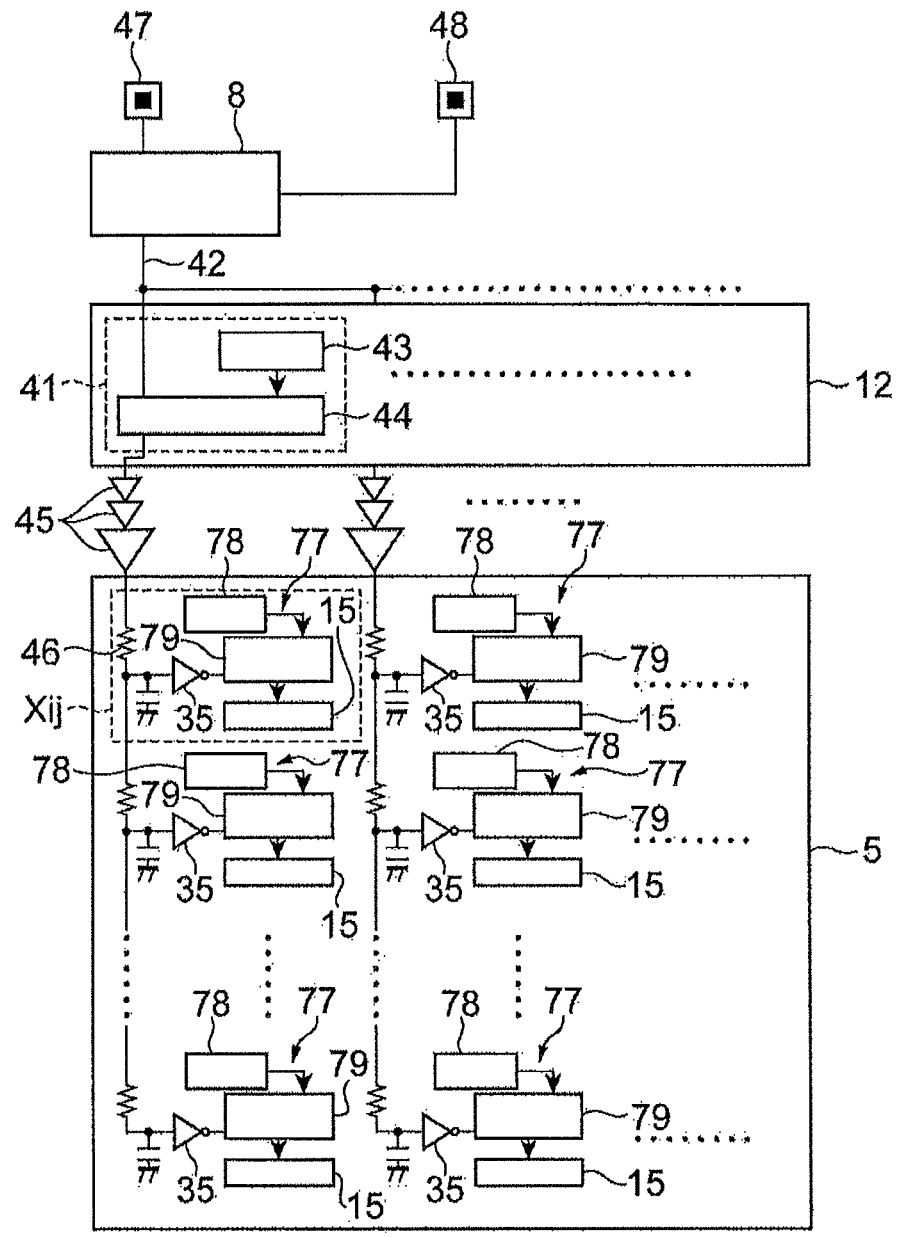
FIG. 13 is a circuit diagram illustrating a connection structure between each pixel Xij in the pixel array portion 5 in another modification of the invention and the timing generation circuit 8.

In addition, FIG. 13 illustrates a connection structure between each pixel Xij in the pixel array portion 5 in another modification of the invention and the timing generation circuit 8. The modification is provided with a plurality of correction circuit units (a second delay adjustment unit) 77 which is provided for each pixel Xij in addition to the column skew correction circuit 12. The correction circuit unit 77 is configured to include a memory 78 which stores a digital value for determining the delay time in each pixel, and a delay adjustment circuit 79 which changes the delay time of the control pulse voltage TW supplied from the timing generation circuit 8 for each pixel in accordance with the digital value read from the memory 78. In detail, the delay adjustment circuit 79 is connected between the buffer circuit 35 in each pixel Xij and the semiconductor element 15, and adjusts the signal delay characteristic for each pixel between the timing generation circuit 8 and each pixel Xij.

According to the configuration illustrated in FIG. 13, the signal delay characteristic of the delay adjustment circuit 79 can be changed for each row by adjusting the digital value stored in the memory 78. Therefore, the difference in transfer delay for each row of the pixels Xij can be easily cancelled.

Figure 14:
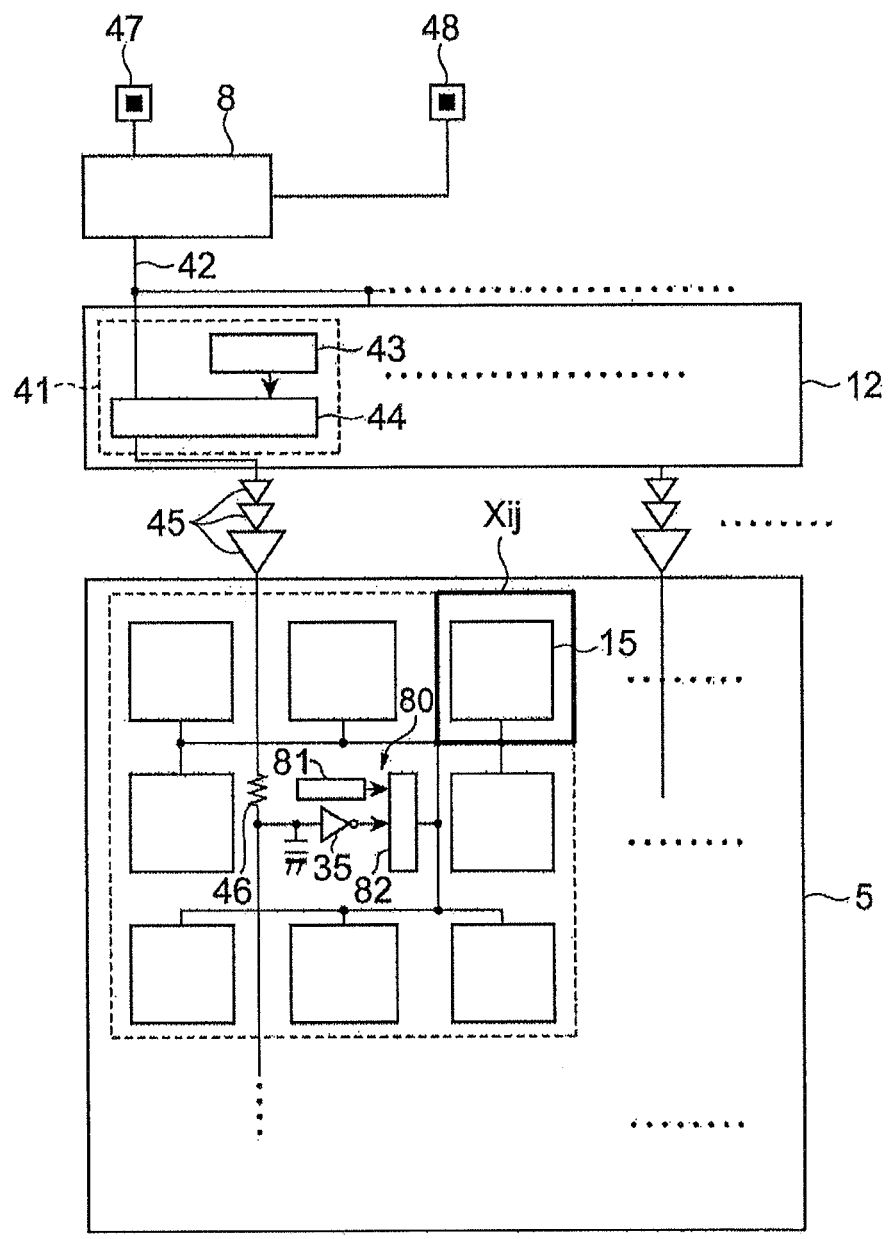
FIG. 14 is a circuit diagram illustrating a connection structure between each pixel Xij in the pixel array portion 5 in still another modification of the invention and the timing generation circuit 8.

In addition, FIG. 14 illustrates a connection structure between each pixel Xij in the pixel array portion 5 in still another modification of the invention and the timing generation circuit 8. In the modification, the plurality of pixels adjacent to each other form a pixel group (for example, a pixel group of eight pixels Xij), and these pixel groups are two-dimensionally arranged to form the pixel array portion 5. Then, the column skew correction circuit 12 is provided for each row of the pixel group, and a plurality of correction circuit units (a second delay adjustment unit) 80 are provided which is provided in the pixel array portion 5 for each pixel group. The correction circuit unit 80 is configured to include a memory 81 which stores a digital value for determining the delay time in the pixel Xij of each pixel group, and a delay adjustment circuit 82 which changes the delay time of the control pulse voltage TW supplied from the timing generation circuit 8 for each pixel Xij of the pixel group in accordance with the digital value read from the memory 81. In detail, the delay adjustment circuit 82 is connected between the buffer circuit 35 and the semiconductor element 15 of eight pixels Xij in each group of the pixels Xij, and the signal delay characteristic between the timing generation circuit 8 and all the pixels Xij of the pixel group is adjusted for each pixel group.

Even according to the configuration illustrated in FIG. 14, the signal delay characteristic of the delay adjustment circuit 82 can be changed for each row of the pixel group by adjusting the digital value stored in the memory 81. Therefore, the difference in transfer delay for each row of the pixels Xij can be easily cancelled.

Further, the invention is not limited to the image sensor which uses a TOF (Time Of Flight) method, and may be applied even to an image sensor for fluorescence life measurement, Raman microspectroscopic imaging, or near infrared microspectroscopic imaging. In addition, the invention may be applied even to a charge modulation element (for example, a lateral (horizontal direction) electric-field control charge modulation element) which includes a plurality of gate electrodes and a plurality of charge accumulation regions and uses two or more gate control signals.

REFERENCE SIGNS LIST

Sa . . . target, 1 . . . camera device (image sensor), 5 . . . pixel array portion, 8 . . . timing generation circuit (clock input unit), 12 . . . column skew correction circuit, 15 . . . semiconductor element, D1 . . . embedded photodiode (light-receiver), 23 . . . light-receiving surface embedded region (light-receiver), 25 . . . charge accumulation region (charge accumulation unit), 27 . . . discharge drain region (charge discharge portion), 31 . . . gate electrode, 35 . . . buffer circuit, 41 . . . correction circuit unit (first delay adjustment unit), 43 . . . memory (storage unit), 44 . . . delay adjustment circuit, 45 . . . buffer circuit, 72 . . . correction circuit unit (second delay adjustment circuit), 73 . . . memory (storage unit), 76 . . . delay adjustment circuit, 77, 80 . . . correction circuit unit (second delay adjustment circuit), 78, 81 . . . memory (storage unit), 79, 82 . . . delay adjustment circuit, Xij . . . pixel (photoelectric conversion element)

The invention claimed is:

1. An image sensor comprising:
a plurality of photoelectric conversion elements including a light-receiver to convert incident light into charges, a charge accumulation unit to accumulate the charges, and a gate electrode to control the charges to be transferred from the light-receiver to the charge accumulation unit, and are one-dimensionally arranged in each of a plurality of columns;
a clock input unit inputting a control clock to be applied to the gate electrode; and
a first delay adjustment unit provided in correspondence with each of the plurality of columns which the photoelectric conversion elements or a group of the photoelectric conversion elements are arranged in, delaying the control clock input by the clock input unit in a variable time, applying the control clock to the gate electrodes of the plurality of photoelectric conversion elements belonging to a corresponding column.

2. The image sensor according to claim 1,
wherein the first delay adjustment unit includes
a storage unit that stores a value for determining a delay time, and
a delay adjustment circuit that changes the signal delay characteristic according to the value stored in the storage unit.

3. The image sensor according to claim 1,
wherein the plurality of photoelectric conversion elements or a group of the plurality of photoelectric conversion elements are further one-dimensionally arranged in each of a plurality of rows,
the plurality of photoelectric conversion elements or the group of the plurality of photoelectric conversion elements further comprising:
a second delay adjustment unit delaying the control clock input by the clock input unit in a variable time for each of the plurality of rows, applying the control clock to the gate electrodes of the plurality of photoelectric conversion elements belonging to a row to which the control clock corresponds.

4. The image sensor according to claim 3,
wherein the second delay adjustment circuit includes
a storage unit provided in accordance with each of the plurality of rows of the photoelectric conversion elements, storing a value for determining a delay time, and
a delay adjustment circuit provided for each of the plurality of photoelectric conversion elements, changing the signal delay characteristic for each row of the photoelectric conversion elements in accordance with the value stored in the storage unit.

5. The image sensor according to claim 3,
wherein the second delay adjustment circuit includes
a storage unit provided for each of the plurality of photoelectric conversion elements, storing a value for determining a delay time, and
a delay adjustment circuit provided for each of the plurality of photoelectric conversion elements, changing the signal delay characteristic for each pixel to which the photoelectric conversion element belongs in accordance with the value stored in the storage unit.

6. The image sensor according to claim 3,
wherein the second delay adjustment circuit includes
a storage unit provided for each group of the plurality of photoelectric conversion elements, storing a value for determining a delay time, a delay adjustment circuit provided for each group of the plurality of photoelectric conversion elements, changing the signal delay characteristic for each group of the photoelectric conversion elements in accordance with the value stored in the storage unit.

* * * * *